United States Patent
Wright

(10) Patent No.: US 8,766,662 B1
(45) Date of Patent: *Jul. 1, 2014

(54) INTEGRITY CHECKING OF CONFIGURATION DATA OF PROGRAMMABLE DEVICE

(75) Inventor: David G. Wright, San Diego, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 40 days.

This patent is subject to a terminal disclaimer.

(21) Appl. No.: 13/229,139

(22) Filed: Sep. 9, 2011

Related U.S. Application Data

(63) Continuation of application No. 11/904,643, filed on Sep. 28, 2007, now Pat. No. 8,125,243.

(60) Provisional application No. 60/906,605, filed on Mar. 12, 2007.

(51) Int. Cl.
  *H03K 19/003* (2006.01)
  *H03M 13/00* (2006.01)
  *H01L 25/00* (2006.01)

(52) U.S. Cl.
  USPC ............... 326/10; 326/41; 714/758; 714/781

(58) Field of Classification Search
  USPC ............... 326/37–41, 9, 10, 93, 95; 327/144,
    327/197–200; 726/27–30; 714/819
  See application file for complete search history.

(56) References Cited

U.S. PATENT DOCUMENTS

| | | | |
|---|---|---|---|
| 5,336,951 A | 8/1994 | Josephson et al. |
| 5,369,703 A | 11/1994 | Archibald et al. |
| 5,376,834 A | 12/1994 | Carobolante |
| 5,481,549 A | 1/1996 | Tokuyama |
| 5,568,083 A | 10/1996 | Uchiyama et al. |
| 5,594,442 A | 1/1997 | Paulos et al. |
| 5,629,635 A | 5/1997 | Reno |
| 5,661,685 A | 8/1997 | Lee et al. |
| 5,664,205 A | 9/1997 | O'Brien et al. |
| 5,693,570 A | 12/1997 | Cernea et al. |
| 5,726,995 A | 3/1998 | Wong |
| 5,748,684 A | 5/1998 | Sanchez |
| 5,838,950 A | 11/1998 | Young et al. |
| 5,877,719 A | 3/1999 | Matsui et al. |
| 5,878,234 A | 3/1999 | Dutkiewicz et al. |

(Continued)

FOREIGN PATENT DOCUMENTS

EP 0619548 A1 10/1994

OTHER PUBLICATIONS

USPTO Non-Final Rejection for U.S. Appl. No. 11/904,644 dated Aug. 9, 2010; 7 pages.

(Continued)

*Primary Examiner* — Alexander Taningco
*Assistant Examiner* — Dylan White

(57) ABSTRACT

Methods and a system for operating a programmable device are disclosed. In one embodiment, a method includes accessing a master summary data and loading an original configuration data to configuration registers of the programmable device. The method further includes generating a current summary data by performing a summary operation of a current configuration data of the configuration registers of the programmable device, comparing the current summary data with the master summary data, and performing an exception action if the current summary data does not match with the master summary data.

20 Claims, 7 Drawing Sheets

(56) References Cited

U.S. PATENT DOCUMENTS

| | | | |
|---|---|---|---|
| 5,925,110 | A | 7/1999 | Klein |
| 6,038,400 | A | 3/2000 | Bell et al. |
| 6,105,155 | A | 8/2000 | Cheng et al. |
| 6,182,163 | B1 | 1/2001 | Yamashita et al. |
| 6,191,614 | B1 | 2/2001 | Schultz et al. |
| 6,195,712 | B1 | 2/2001 | Pawlowski et al. |
| 6,253,268 | B1 | 6/2001 | Bjorkengren et al. |
| 6,256,240 | B1 | 7/2001 | Shinozaki |
| 6,260,139 | B1 | 7/2001 | Alfke |
| 6,281,716 | B1 | 8/2001 | Mihara |
| 6,320,809 | B1 | 11/2001 | Raad |
| 6,330,231 | B1 | 12/2001 | Bi |
| 6,400,605 | B1 | 6/2002 | Adkins |
| 6,429,682 | B1 | 8/2002 | Schultz et al. |
| 6,499,123 | B1 | 12/2002 | Mcfarland et al. |
| 6,509,845 | B1 | 1/2003 | Tanaka |
| 6,577,157 | B1 | 6/2003 | Cheung et al. |
| 6,798,254 | B2 | 9/2004 | Marshall et al. |
| 6,865,113 | B2 | 3/2005 | Voicu et al. |
| 6,912,606 | B2 | 6/2005 | Fay |
| 7,030,668 | B1 | 4/2006 | Edwards |
| 7,089,434 | B2 | 8/2006 | Kuo |
| 7,096,137 | B2 | 8/2006 | Shipton et al. |
| 7,107,178 | B2 | 9/2006 | Won et al. |
| 7,174,144 | B2 | 2/2007 | Lin |
| 7,176,726 | B2 | 2/2007 | Bock |
| 7,228,476 | B2 | 6/2007 | Scipioni et al. |
| 7,304,923 | B2 | 12/2007 | Sano et al. |
| 7,310,757 | B2 * | 12/2007 | Ngo et al. .................. 714/725 |
| 7,385,418 | B2 * | 6/2008 | Speers et al. .................. 326/39 |
| 7,392,409 | B2 | 6/2008 | Tateyama |
| 7,392,447 | B2 | 6/2008 | Tang et al. |
| 7,415,624 | B2 | 8/2008 | Miller et al. |
| 7,415,647 | B2 | 8/2008 | Yee |
| 7,496,692 | B2 * | 2/2009 | Holm et al. .................. 710/8 |
| 7,508,242 | B2 | 3/2009 | Tokuno |
| 7,532,056 | B2 | 5/2009 | Seo |
| 7,596,744 | B1 * | 9/2009 | Kow et al. .................. 714/819 |
| 8,010,871 | B1 * | 8/2011 | Kow et al. .................. 714/758 |
| 8,125,243 | B1 * | 2/2012 | Wright .................. 326/41 |
| 8,176,296 | B2 * | 5/2012 | Snyder .................. 712/32 |
| 2002/0108011 | A1 | 8/2002 | Tanha |
| 2003/0074364 | A1 | 4/2003 | Sewall et al. |
| 2003/0093751 | A1 | 5/2003 | Hohl |
| 2005/0071730 | A1 * | 3/2005 | Moyer et al. .................. 714/758 |
| 2005/0074051 | A1 | 4/2005 | Won et al. |
| 2005/0093572 | A1 * | 5/2005 | Sun et al. .................. 326/38 |
| 2005/0093582 | A1 | 5/2005 | Bock |
| 2005/0105366 | A1 * | 5/2005 | Pedlow, Jr. .................. 365/225.7 |
| 2006/0212838 | A1 | 9/2006 | Carson et al. |
| 2006/0236147 | A1 | 10/2006 | Best et al. |
| 2007/0094420 | A1 | 4/2007 | Holm et al. |
| 2007/0183205 | A1 | 8/2007 | Lee |
| 2008/0071972 | A1 | 3/2008 | Kimura |
| 2008/0086626 | A1 | 4/2008 | Jones et al. |
| 2009/0315582 | A1 | 12/2009 | Agatsuma |
| 2013/0325996 | A1 * | 12/2013 | Selig .................. 709/208 |

OTHER PUBLICATIONS

USPTO Notice of Allowance for U.S. Appl. No. 11/973,038 dated Jan. 6, 2011; 6 pages.

USPTO Notice of Allowance for U.S. Appl. No. 11/973,090 dated Sep. 30, 2010; 6 pages.

USPTO Notice of Allowance for U.S. Appl. No. 12/005,768 dated Jun. 28, 2010; 6 pages.

USPTO Notice of Allowance for U.S. Appl. No. 12/005,775 dated Feb. 12, 2010; 6 pages.

USPTO Notice of Allowance for U.S. Appl. No. 12/005,775 dated Jun. 19, 2009; 6 pages.

USPTO Requirement for Restriction for U.S. Appl. No. 12/005,768 dated May 11, 2009; 6 pages.

USPTO Requirement for Restriction/Election for U.S. Appl. No. 11/691,676 dated Aug. 1, 2008; 6 pages.

U.S. Appl. No. 12/005,743: "Acquiring a Mode of an Integrated Circuit," David G. Wright, filed Dec. 27, 2007; 33 pages.

U.S. Appl. No. 12/005,748: "Firmware Memory of an Integrated Circuit," David G. Wright, filed Dec. 28, 2007; 31 pages.

U.S. Appl. No. 12/005,950: "Ultra Low Power Sleep Mode," David G. Wright, filed Dec. 28, 2007; 30.

U.S. Appl. No. 12/075,633: "Encoded Acknowledge Signal for Wireless Communication," David G. Wright, filed Mar. 12, 2008; 28 pages.

U.S. Appl. No. 12/075,748: "Secure Wireless Transmission," David G. Wrigh, filed Mar. 12, 2008; 25 pages.

National Semiconductor, "54150/DM54150/DM741150, 54151A/DM54151A/DM74151A Data Selectors/Multiplexers," Datasheet, Jun. 1989, Downloaded from <www.DatasheetCatalog.com>, pp. 1-10; 11 pages.

USPTO Advisory Action for U.S. Appl. No. 11/891,878 dated Aug. 5, 2009; 3 pages.

USPTO Advisory Action for U.S. Appl. No. 11/904,644 ,dated Mar. 28, 2011; 2 pages.

USPTO Advisory Action for U.S. Appl. No. 11/904,644 dated Jul. 16, 2010; 3 pages.

USPTO Advisory Action for U.S. Appl. No. 11/973,090 dated May 20, 2010; 2 pages.

USPTO Advisory Action for U.S. Appl. No. 12/075,632 dated Apr. 19, 2010; 3 pages.

USPTO Final Rejection for U.S. Appl. No. 11/891,876 dated Feb. 26, 2010; 11 pages.

USPTO Final Rejection for U.S. Appl. No. 11/691,676 dated May 27, 2009; 10 pages.

USPTO Final Rejection for U.S. Appl. No. 11/904,644 dated Apr. 28, 2010; 7 pages.

USPTO Final Rejection for U.S. Appl. No. 11/973,038 dated Mar. 25, 2010; 5 pages.

USPTO Final Rejection for U.S. Appl. No. 11/973,090 dated Mar. 9, 2010; 7 pages.

USPTO Final Rejection for U.S. Appl. No. 12/005,748 dated Sep. 24, 2010; 15 pages.

USPTO Final Rejection for U.S. Appl. No. 12/005,774 dated Mar. 23, 2010; 14 pages.

USPTO Final Rejection for U.S. Appl. No. 12/075,632 dated Nov. 26, 2010; 10 pages.

USPTO Final Rejection for U.S. Appl. No. 12/075,632 dated Feb. 3, 2010; 9 pages.

USPTO Final Rejection for U.S. Appl. No. 12/075,633 dated Nov. 24, 2010; 13 pages.

USPTO Non-Final Rejection for U.S. Appl. No. 11/691,678 dated Oct. 20, 2009; 11 pages.

USPTO Non-Final Rejection for U.S. Appl. No. 11/691,676 dated Nov. 28, 2008; 8 pages.

USPTO Non-Final Rejection for U.S. Appl. No. 11/904,643 dated Apr. 3, 2009; 9 pages.

USPTO Non-Final Rejection for U.S. Appl. No. 11/904,643 dated Sep. 2, 2011; 10 pages.

USPTO Non-Final Rejection for U.S. Appl. No. 11/904,644 dated Oct. 28, 2009; 6 pages.

USPTO Non-Final Rejection for U.S. Appl. No. 11/973,038 dated Jul. 1, 2010; 5 pages.

USPTO Non-Final Rejection for U.S. Appl. No. 11/973,038 dated Oct. 23, 2009; 5 pages.

USPTO Non-Final Rejection for U.S. Appl. No. 11/973,090 dated Jun. 22, 2010; 7 pages.

USPTO Non-Final Rejection for U.S. Appl. No. 11/973,090 dated Sep. 21, 2009; 7 pages.

USPTO Non-Final Rejection for U.S. Appl. No. 12/005,743 dated Jun. 7, 2010; 11 pages.

USPTO Non-Final Rejection for U.S. Appl. No. 12/005,748 dated May 11, 2010; 14 pages.

USPTO Non-Final Rejection for U.S. Appl. No. 12/005,768 dated Feb. 16, 2010; 8 pages.

USPTO Non-Final Rejection for U.S. Appl. No. 12/005,768 dated Aug. 20, 2009; 7 pages.

USPTO Non-Final Rejection for U.S. Appl. No. 12/005,774 dated Oct. 27, 2010; 14 pages.

(56) References Cited

OTHER PUBLICATIONS

USPTO Non-Final Rejection for U.S. Appl. No. 12/005,774 dated Sep. 15, 2009; 12 pages.
USPTO Non-Final Rejection for U.S. Appl. No. 12/005,775 dated Feb. 11, 2009; 5 pages.
USPTO Non-Final Rejection for U.S. Appl. No. 12/005,775 dated Sep. 22, 2009; 4 pages.
USPTO Non-Final Rejection for U.S. Appl. No. 12/005,950 dated Sep. 13, 2010; 8 pages.
USPTO Non-Final Rejection for U.S. Appl. No. 12/075,632 dated May 25, 2010; 9 pages.
USPTO Non-Final Rejection for U.S. Appl. No. 12/075,632 dated Jun. 24, 2009; 6 pages.
USPTO Non-Final Rejection for U.S. Appl. No. 12/075,633 dated Apr. 26, 2010; 11 pages.
USPTO Notice of Allowance for U.S. Appl. No. 11/691,676 dated Jun. 24, 2010; 10 pages.
USPTO Notice of Allowance for U.S. Appl. No. 11/904,643 dated Jan. 12, 2011; 7 pages.
USPTO Notice of Allowance for U.S. Appl. No. 11/904,643 dated Feb. 26, 2010; 8 pages.
USPTO Notice of Allowance for U.S. Appl. No. 11/904,643 dated May 3, 2011; 9 pages.
USPTO Notice of Allowance for U.S. Appl. No. 11/904,643 dated Jun. 11, 2010; 8 pages.
USPTO Notice of Allowance for U.S. Appl. No. 11/904,643 dated Sep. 28, 2010; 8 pages.
USPTO Notice of Allowance for U.S. Appl. No. 11/904,843 dated Sep. 28, 2011; 9 pages.
USPTO Notice of Allowance for U.S. Appl. No. 11/904,643 dated Nov. 3, 2009; 7 pages.

* cited by examiner

INTEGRITY CHECKING OF CONFIGURATION DATA OF PROGRAMMABLE DEVICE

RELATED APPLICATIONS

This application is a continuation of U.S. patent application Ser. No. 11/904,643, filed Sep. 28, 2007, which claims the priority of U.S. Provisional Patent Application No. 60/906,605, filed Mar. 12, 2007, both of which are incorporated herein by reference.

FIELD OF TECHNOLOGY

Embodiments of the present invention relate to the field of electronics. More particularly, embodiments of the present invention relate to configuration data of a programmable device.

BACKGROUND

A programmable device (e.g., a programmable microcontroller) contains configuration registers which hold configuration data to establish functional blocks (e.g., which perform user-defined logic functions), I/O blocks (e.g., which configures input/output blocks interfacing to external devices), and/or signal routing resources (e.g., which connect the functional blocks to each other and/or the I/O blocks).

The configuration data may be represented as configuration bits of configuration registers (e.g., stored as volatile memory). Upon the boot-up of the programmable device, the configuration data stored in non-volatile memory may be copied to the configuration registers of the volatile memory. However, the configuration data residing in the configuration registers may be compromised due to several factors.

For example, an unintended software execution may create a write-over condition where improper data may be written to the configuration registers. Additionally, cosmic rays, X-rays, and/or other environmental factors may cause the configuration data to degrade (e.g., flip); these are known as soft errors. These errors (e.g., the write-over, soft errors, etc.) of the configuration data may compromise the functional block, the I/O blocks, and/or the routing resources, thereby rendering the programmable device inoperable for its intended purposes.

In case when the programmable device is used in a critical condition (e.g., involving an emergency situation) or life critical function, the reliability of the programmable device becomes ever more critical. For instance, the functionality of an airbag deployment system may rely on the operation of a programmable device. Furthermore, the configuration data (e.g., bits) become more susceptible to the soft errors as the feature size (e.g., a silicon geometry) of the programmable device gets smaller.

SUMMARY

Accordingly, what is needed is a method and system that can increase the reliability of programmable devices. Embodiments of the present invention provide these advantageous functionalities.

One embodiment of the present invention pertains to a method for continuously checking the integrity of configuration data of a programmable device. More specifically, the method includes (a) accessing a master summary data and (b) generating a current summary data by performing a summary operation of current configuration data of configuration registers. The method further includes (c) comparing the current summary data with the master summary data and (d) performing an exception action if the current summary data does not match with the master summary data. Steps (b) through (d) are repeated as long as there is no mismatch between the current summary data and the master summary data.

Embodiments also include correcting any data inconsistencies upon detecting a CRC mismatch. Embodiments also include storing one or more CRCs to protect against soft errors of the master CRC.

As illustrated in the detailed description, other embodiments also pertain to methods and systems that provide a novel way to check the integrity of the configuration data in programmable devices, and in particular, continuously checking the integrity of the configuration data loaded to the programmable devices in an unobtrusive way. Through utilizing the error checking methods and systems, the embodiments provide more robust and dependable programmable device.

BRIEF DESCRIPTION OF THE DRAWINGS

Example embodiments are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the claims. Furthermore, in the detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

I. Configuration of Programmable Device Using a DMA Controller

Figure 1:
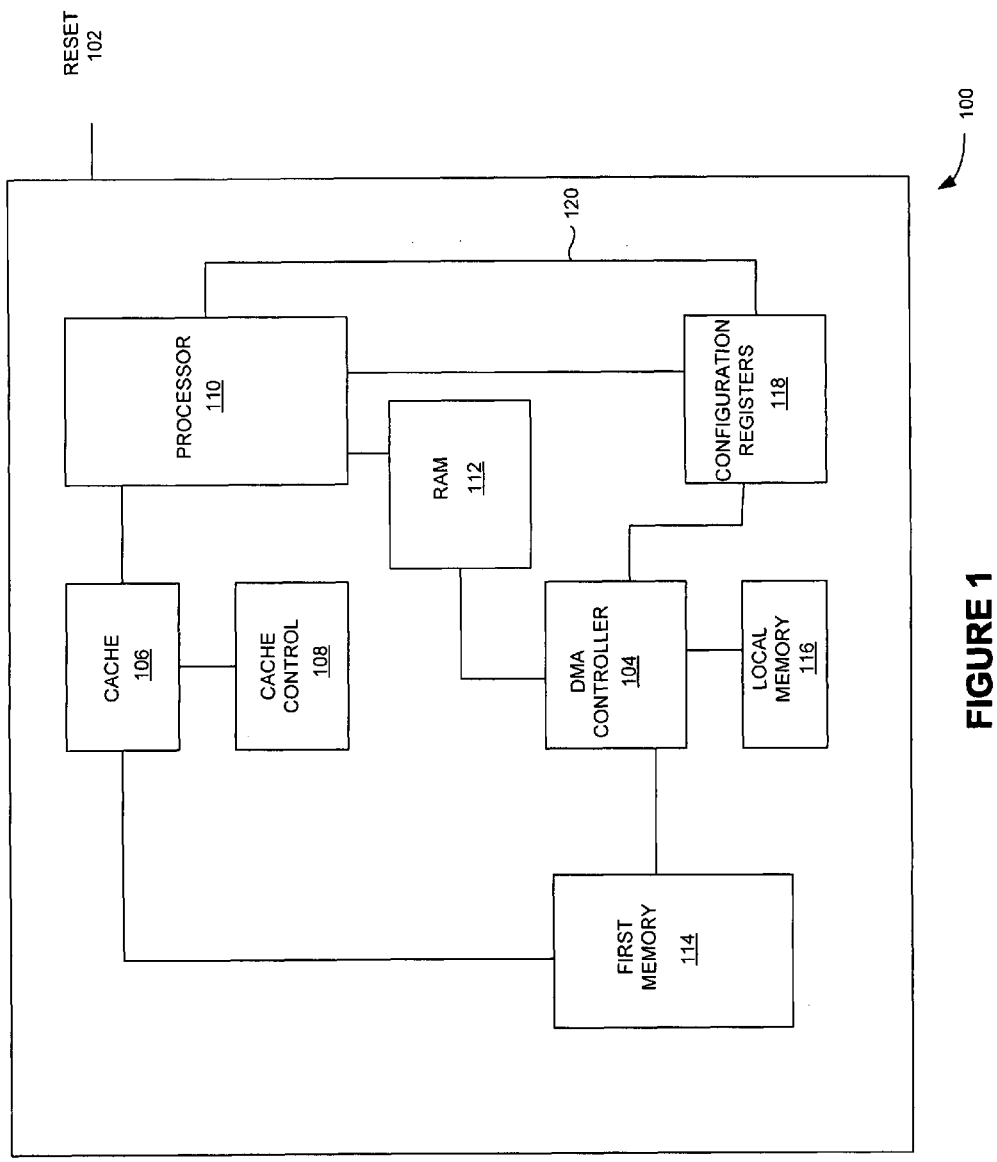
FIG. 1 is a block diagram of an exemplary programmable device with a configuration system utilizing a DMA controller, according to one embodiment.

FIG. 1 is a block diagram of an exemplary programmable device 100 with a configuration system utilizing a DMA controller 104, according to one embodiment. FIG. 1 illustrates a reset 102, a DMA controller 104, a cache 106, a cache control 108, a processor 110 (e.g., a central processing unit (CPU)), a random access memory (RAM) 112, a first memory 114, a local memory 116, configuration registers 118, and/or an wait signal 120, according to one embodiment.

The programmable device 100 may be a microcontroller or any programmable device with a DMA controller (e.g., a PLD, a FPGA, etc.). The programmable device 100 may be a programmable system on chip (PSoC), a configurable system on chip (a CSoC), or a field programmable array gate with an embedded microprocessor. The reset 102 may be an input or may be generated internally and delete some or all volatile information stored in the programmable device 100. The programmable device 100 may be configured when the processor 110 of the programmable device 100 is placed to a non-executing state. For example, once the reset 102 is released, the programmable device 100 may be configured with configuration data (e.g., default configuration data). The reset 102 may include a reset during a run time operation, a master reset during an initialization, a power-on reset, a watchdog reset, and an external reset of the programmable device 100.

The DMA controller 104 is a dedicated data transfer device which reads data from a first memory location to a second memory location. A direct memory access (DMA) based on the DMA controller 104 is efficient because a dedicated piece of hardware (e.g., the DMA controller 104) responds to and/or performs a transaction request more quickly than the processor 110, which may take several read/write cycles to copy an item of data from memory (eg 114) to configuration registers.

The cache 106 (e.g., controlled by the cache controller 108) is a temporary storage area where frequently accessed data may be stored for rapid access (e.g., by the processor 110). The processor 110 may be placed in a reset mode during the configuration process utilizing the DMA controller 104. The RAM 112 may be a volatile memory dedicated to the processor 110 and/or may also be accessible by the DMAC. The first memory 114 (e.g., non-volatile memory) is used to store program codes (e.g., software, etc.) and/or configuration data. The first memory 114 may be a read only memory (ROM), an EPROM, a flash memory, and/or a non-volatile random access memory (NVRAM).

The local memory 116 stores transaction descriptors used to define the behavior of the DMAC which may include configuring the configuration registers 118. The transaction descriptors may be meta-data which describe the properties (e.g., address, length, type, priority, etc. of data being transferred) of corresponding transactions (e.g., data transfer operations). The local memory 116 may be a volatile memory (e.g., a random access memory).

The configuration registers 118 contain registers used for configuring logic blocks of the programmable device, such as configuring input/output resources, programmable analog blocks, programmable digital blocks, routing resources, etc. The number of configuration registers may be quite large on complex programmable devices. The wait signal 120 may be de-asserted to release the processor 110 from the reset mode when the configuration process is completed.

In one example embodiment illustrated in FIG. 1, a user or an external event may initiate the reset 102 or any other configuration signal of the programmable device 100. As the reset 102 is released, the DMA controller 104 may load Transaction Descriptors (TSs) to control data transactions described in details in FIG. 2. The DMA controller 104 may secure a bus access for data transactions based on a DMA request.

With the bus secured, data of the program memory 114 may be transferred to the local memory 116 and/or to the configuration registers 118. The data transactions utilizing the DMA controller 104 may be faster compared to ones using the processor 110 because the DMA controller 104 may be dedicated to solely moving data between memories and/or registers.

Additionally, the data transaction may be transparent to the user of the programmable device 100 because the data transaction is run in the background rather than in the foreground. The processor 110 would take longer if it were to complete the data transaction instead of the DMA controller 104.

Once the data transaction to configure the configuration registers 118 is completed, the wait signal 120 may be de-asserted to the processor 110 to notify the completion of the configuration, thus releasing the processor 110 from the reset mode. When the wait signal 120 is processed by the processor 110, the processor 110 may commence normal operations (e.g., thus transitioning from the reset state to the runtime mode).

Figure 2:
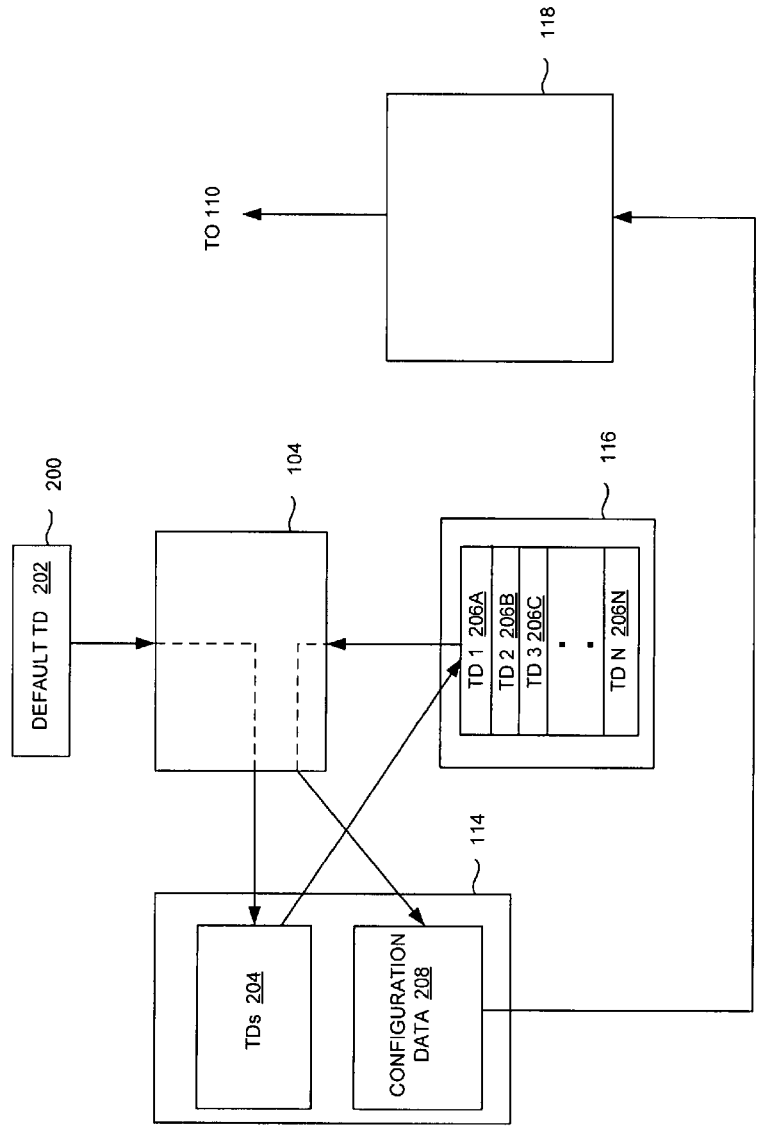
FIG. 2 is a system diagram of the configuration system of FIG. 1, according to one embodiment.

FIG. 2 is a system diagram of the configuration system of FIG. 1, according to one embodiment. FIG. 2 illustrates a second memory 200, a default transaction descriptor (TD) 202, transaction descriptors 204, a configuration TD 1 206A, a configuration TD 2 206B, a configuration TD 3 206C, a configuration TD N 206N, and configuration data 208 along with the DMA controller 104, the first memory 114, the local memory 116, and the configuration registers 118.

The second memory is a non-volatile memory storing the default TD 202. The default TD 202 is hard coded in the device as opposed to other codes configurable by the user. As the reset 102 of FIG. 1 is released, the default TD 202 is automatically loaded to the DMA controller 104 to initiate the configuration process. The configuration TDs 204 are transaction descriptors which oversee the configuration process. The configuration TDs 204 may includes one or more fields which include a source address, a destination address, a priority, and a size of data being transferred as well as a transaction type. The configuration TDs 204 may be moved to the local memory 116 when the default TD 202 is processed by the DMA controller 104 (e.g., to perform a transaction to move the configuration TDs 204 to the local memory 116).

The function of the default TD 202 is to control the movement of config TDs 206 from 114 to 116. The function of the sequence of TDs in the local memory 116 is to load the configuration registers 118 with the configuration data 208.

The configuration TD 1 206A, the configuration TD 2 206B, the configuration TD 3 206C, and other configuration TDs (e.g., the configuration TD N 206N) may be chained such that the configuration TD 2 206B may be automatically processed by the DMA controller 104 after the configuration TD 1 206A is processed and the configuration TD 3 206C after the configuration TD 2 206B. This process may continue until the configuration TD N 206N is processed. At this time, all the configuration data 208 of the currently selected configuration of the device has been loaded into the configuration registers 118. The configuration data 208 may be a stream of bits used to configure the functional blocks, I/O blocks, and/or signal routing resources of the programmable device 100 of FIG. 1.

In one example embodiment, a system to configure the programmable device 100 may include the DMA controller 104 and the local memory 116. When the reset 102 is released (e.g., to initiate a configuration process), the default TD 202 (e.g., which may be stored in a non-volatile memory) is first loaded to the DMA controller 104 to initiate a transaction to transfer the configuration TDs 204 to the local memory 116. The validity of the configuration TDs 204 may be checked before the transaction takes place, as will be illustrated in details in FIG. 4.

At the same time, a DMA request may be processed by the DMA controller 104 to secure bus bandwidth necessary to transfer data (e.g., the configuration TDs 204 and the configuration data 208). This DMA request may be triggered automatically on release of reset. Once the bus access is secured, the configuration TDs 204 are loaded to the local memory 116. The configuration TDs in the local memory 116 may be chained to each other (e.g., sequentially such that when the data transfer defined by one TD completes the data transfer defined by the next TD in the sequence begins automatically).

For instance, the configuration TD 1 206A may be chained to the default TD 202, the configuration TD 2 206B to the configuration TD 1 206A, the configuration TD 3 206C to the configuration TD 2 206B, and so forth. As each configuration TD in the TD memory 116 (e.g., the configuration TD 1 206A, the configuration TD 2 206B, the configuration TD 3 206C, the configuration N 206N) is processed, a memory block defined by it may be transferred from the first memory 114 to the configuration registers 118. As the TDs in the local memory 116 are processed by the DMA controller 104, the configuration data 208 are loaded to the configuration registers 118.

The chain of configuration TDs may enable a seamless performance of the configuration process such that only needed portions of the first memory 114 may be copied to the configuration registers 118 rather than copying an entire block of the first memory 114. The transfer of individual blocks of configuration data defined by each of the configuration TDs may be more efficient because there is less waste of the first memory 114.

For instance, if an entire block of memory required for the configuration of the configuration registers 118 was to be transferred, several large sized blocks of the first memory 114 would be needed to store a different combinations of the configuration data 208. With the ability to select individual blocks of the first memory 114 from a chunk of the first memory 114 according to the transaction TDs 204, the transfer of the configuration data 208 would become more efficient.

As the configuration TD N 206N is processed (e.g., writing the last bit of the configuration data 208 to the configuration registers 118), the wait signal 120 of FIG. 1 may be released to communicate to the processor 110 (e.g., reporting the end of the configuration process). Once the processor 110 processes the wait signal 120, the processor 110 may commence the runtime operation releasing itself from the reset mode.

Figure 3:
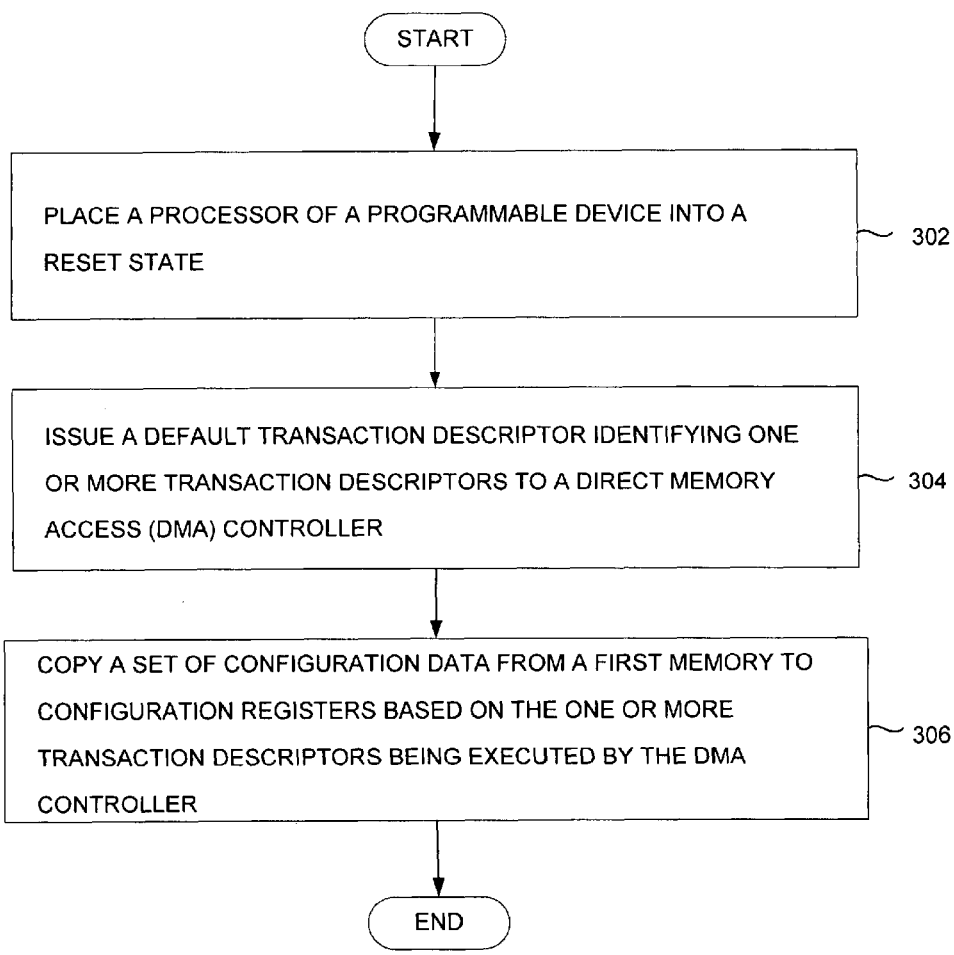
FIG. 3 is a process flow chart of an exemplary process for loading configuration data to configuration registers based on transaction descriptors, according to one embodiment.

FIG. 3 is a process flow chart of an exemplary process for loading configuration data to configuration registers based on transaction descriptors, according to one embodiment. In operation 302, a processor (e.g., a CPU) of a programmable device (e.g., PSoC) is placed into a reset state (e.g., during the runtime operation or the initialization of the programmable device). In operation 304, a default transaction descriptor (e.g., which may be stored in a dedicated non-volatile memory) identifying one or more transaction descriptors (e.g., stored in a non-volatile memory) is issued to a direct memory access (DMA) controller. During the operation, the one or more transaction descriptors may be copied from a non-volatile memory to a volatile memory using the DMA controller.

In operation 306, a set of configuration data are copied from a first memory (e.g., the non-volatile memory) to configuration registers based on the one or more transaction descriptors (e.g., chained) being processed by the DMA controller. Additionally, the processor may be released from the reset state after the last one of the one or more transaction descriptors (e.g., which writes last block of the configuration data to the configuration registers) is executed by the DMA controller.

Figure 4:
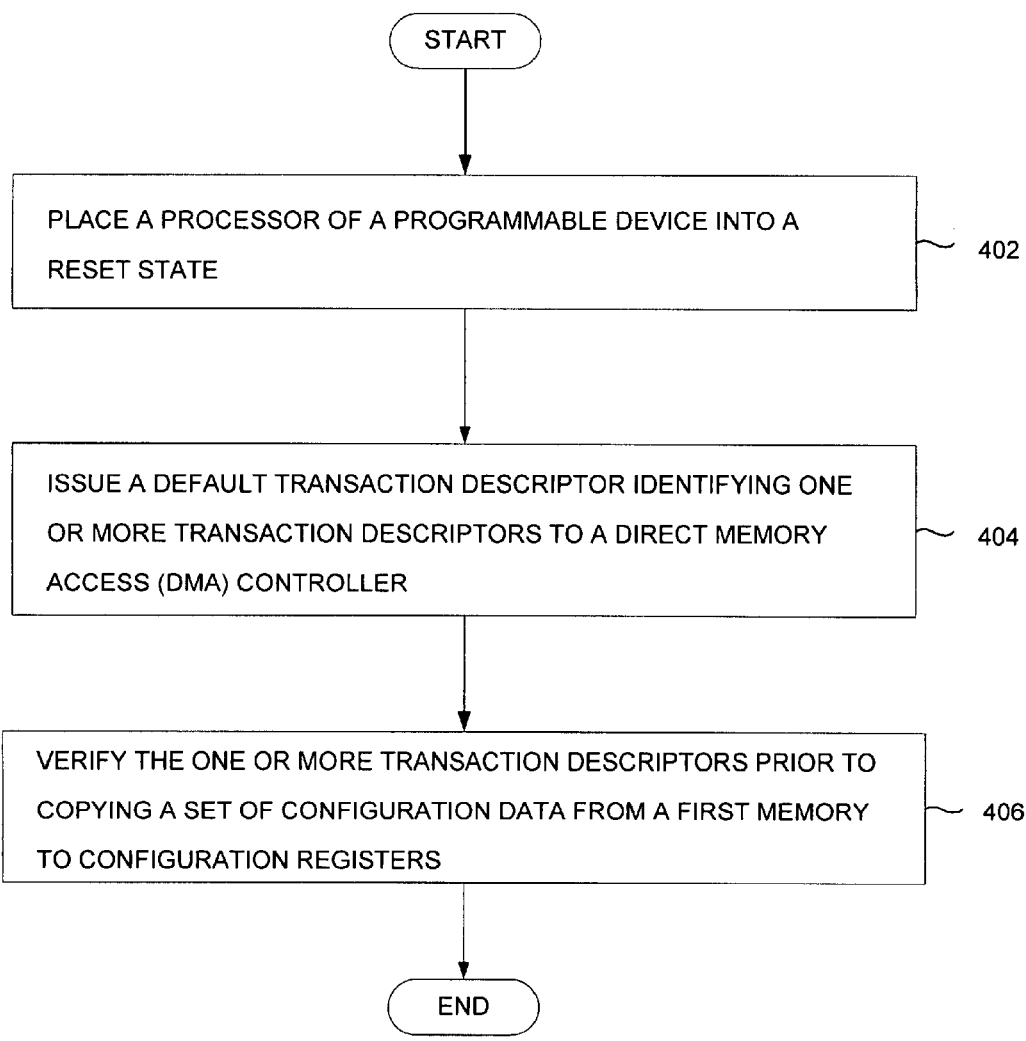
FIG. 4 is a process flow chart of an exemplary process for checking the validity of transaction descriptors, according to one embodiment.

FIG. 4 is a process flow chart of an exemplary process for checking the validity of transaction descriptors, according to one embodiment. The validity of transaction descriptors may be checked to prevent the device from "going crazy" if the first memory 114 is erased and/or corrupted since processing the erased memory as TDs could result in strange and/or unpredictable behavior. In operation 402, a processor of a programmable device is placed into a reset state. In operation 404, a default transaction descriptor identifying one or more transaction descriptors is issued to a direct memory access (DMA) controller. In operation 406, the one or more transaction descriptors are verified prior to copying a set of configuration data from a first memory to configuration registers. When the transaction descriptors are found to be invalid, an event (e.g., halting the loading of the set of configuration data to the configuration registers) may be generated.

In one example embodiment, field types of the one or more transaction descriptors may be compared with expected field types of the one or more transaction descriptors (e.g., a source address, a destination address, a priority, and/or a size of the configuration data) to verify the transaction descriptors. When the verification fails, the copying the set of configuration data may be bypassed. In another example embodiment, a checksum or a cyclic redundancy check (CRC) of the one or more transaction descriptors may be performed for the verification.

Figure 5:
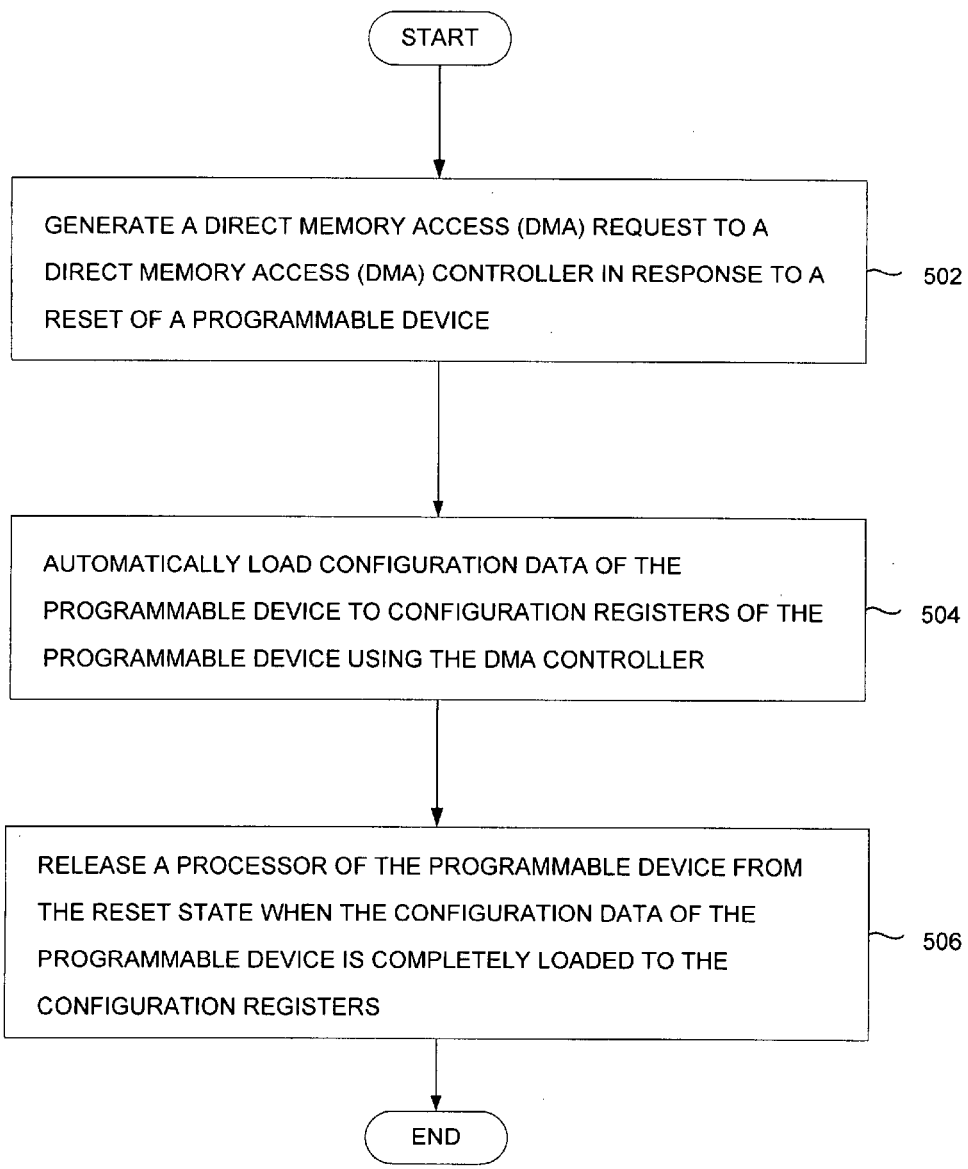
FIG. 5 is a process flow chart of an exemplary process for loading configuration data to configuration resisters using the DMA controllers, according to one embodiment.

FIG. 5 is a process flow chart of an exemplary process for loading configuration data to configuration resisters through channels enabled by a DMA controller, according to one embodiment. In operation 502, a direct memory access (DMA) request is generated to a DMA controller in response to a reset of a programmable device (e.g., a PSoC, a FPGA, etc.). During the reset of the programmable device, a processor of the programmable device may be placed in a reset state. In operation 504, configuration data of the programmable device are automatically loaded to configuration registers of the programmable device using the DMA controller. In operation 506, a processor of the programmable device is released from the reset state when the configuration data of the programmable device is completely loaded to the configuration registers.

II. Continuous Integrity Checking of Configuration Data of Programmable Device

Figure 6:
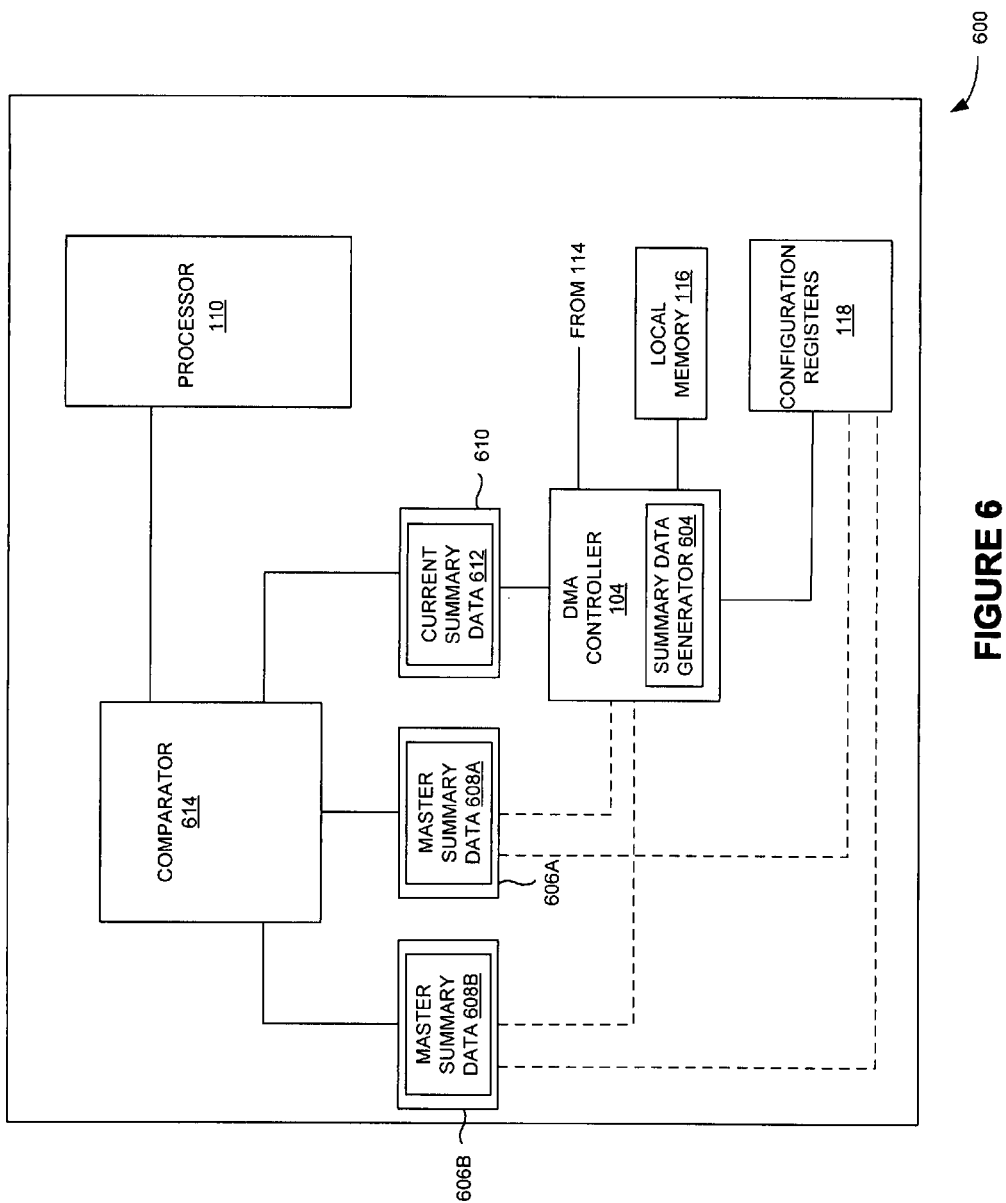
FIG. 6 is a block diagram of a programmable device with a system to maintain the integrity of configuration data, according to one embodiment.

FIG. 6 is a block diagram of a programmable device 600 (e.g., a microcontroller, a PLD, a FPGA, etc.) with a system to maintain the integrity of the configuration data, according to one embodiment. FIG. 6 illustrates a summary data generator 604, a first memory 606A, an auxiliary memory 606B, a master summary data 608A, a master summary data 608B, a second memory 610, a current summary data 612, and a comparator 614 along with the DMA controller 104, the processor 110, the first memory 114, and the configuration registers 118 of FIG. 1.

The summary generator 604 generates the current summary data 612 by performing a summary operation of current configuration data of configuration registers of the programmable device 600. The first memory 606A and the auxiliary memory 606B may be a flash memory or any non-volatile memory. The master summary data 608A may be a summary data obtain through performing a summary operation of the configuration data upon their initial loading to the configuration registers 118. The master summary data 608B is optional and may be a duplicate of the master summary data 608A.

The second memory 610 may be a flash memory or any non-volatile memory. The current summary data 612 may be the most recent summary data stored to the second memory 610 until next summary data writes over the current summary data 612 (e.g., thus the next summary data becoming the current summary data 612). The comparator 614 may be a device which compares the current summary data 612 with the master summary data 608A. The comparator may be also used to compare the master summary data 608A and the master summary data 608B.

The configuration data may be default configuration data or user-defined configuration data. When the configuration data are loaded to the configuration registers 118, the DMA controller 104 may be used to access (e.g., read) the configuration data to perform a summary operation. The summary operation may be based on one of many methods of checking the integrity of the configuration data, such as redundancy check (e.g., a checksum, a cyclic redundancy check, a horizontal redundancy check, a vertical redundancy check and a cryptographic message digest).

Once the master summary data 608A is obtained (e.g., through reading a user-supplied data or through a calculation based on the summary operation), the configuration data 118 may be continuously accessed (e.g., read) by the DMA controller 104 to continuously perform the summary operation on the configuration data 118 during the operation of the programmable device 600. Once the current summary data 612 is ready, the comparator 614 may compare it with the master summary data 608A. The current summary data 612 may be refreshed when a next round of the summary operation on the configuration data 118 is performed. The comparator 614 may then check the current summary (e.g., refreshed) data 612 with the master summary data 608A. This process may continue until the comparator 614 detects a mismatch between the master summary data 608A and the current summary data 612. The mismatch may indicate a degradation of the configuration data in the configuration registers 118 due to many factors (e.g., soft errors). If no mismatch is detected, the above process is repeated continuously.

Once the comparator 614 detects the mismatch, an exception action or signal (e.g., an interrupt data, a flag, etc.) may be generated and communicated to the processor 110 of FIG. 1 to initiate a corrective action. Based on the interrupt data, the processor 110 may initiate the reloading of the configuration registers 118 from the first memory 114 (e.g., a flash memory and/or different from the first memory 606A) with the original set of configuration data. Alternatively, the reset 102 may be asserted to initiate a new configuration process, such as the one based on the DMA controller 104 as illustrated in FIGS. 1 and 2. In one example embodiment, the mismatch may flag a fatal error to the processor 110.

In another example embodiment, the master summary data 608B, a duplicate of the master summary data 608A, may be generated. The master summary data 608A may be compared with the master summary data 608B (e.g., and/or with other duplicates of the master CRC data 608A) continuously and/or intermittently using the comparator 614. When there is a mismatch, a fresh set of configuration data may be loaded to the configuration registers 118 and/or a new set of the master summary data 608A and the master summary data 608B may be obtained and/or a fatal error may be communicated to the processor.

It is appreciated that the system to maintain the integrity of the configuration data may be transparent to the user of the programmable device 600 and/or the system may not hinder the performance (e.g., speed) of the programmable device 600 in any major way. For instance, the DMA controller 104 may assign the lowest bus priority to the system (e.g., the priority 7 on a scale of 0-7 where 7 is the lowest), such that the performance of other operations may not be sacrificed. Nevertheless, 8K bytes of configuration data may be able to perform the CRC 125 times per second when the speed of the DMA controller 104 is 100 MHz and a Priority 7 DMA is allocated 1% of the available bus clock cycles, according to one embodiment. Alternatively, the processor 110 rather than the DMA controller 104 may oversee the system to maintain the integrity of the configuration data (e.g., although this may sacrifice the performance of the programmable device 600).

Figure 7:
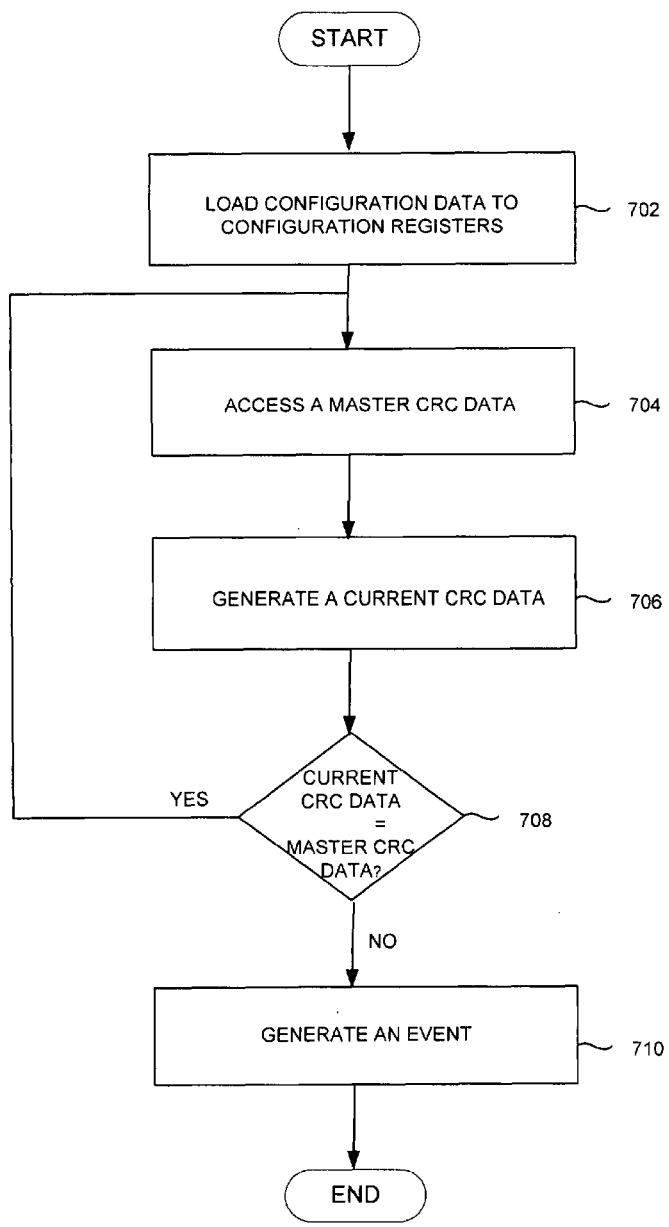
FIG. 7 is a process flow chart of an exemplary process for iteratively comparing a current cyclic redundant check (CRC) data with a master CRC data to preserve the integrity of configuration data, according to one embodiment.

FIG. 7 is a process flow chart of an exemplary process for checking the integrity of configuration data by performing a cyclic redundancy check (CRC) of configuration data, according to one embodiment. In operation 702, the configuration data are loaded to configuration registers of the programmable device. In operation 704, a master CRC data is accessed (e.g., from data supplied or based on a cyclic redundancy check applied to the configuration data). In operation 706, a current CRC data (e.g., through applying the cyclic redundancy check to current configuration data) is generated. In operation 708, the current CRC data is compared with the master CRC data. If there is mismatch, an event is generated in operation 710. Otherwise, operations 704, 706, and 708 are repeated.

Alternatively, redundancy check (RC) other than the CRC may be performed on the configuration data. For instance, checksums, a horizontal redundancy check, a vertical redundancy check, and a cryptographic message digest may be utilized to produce a similar result. Then, a current RC data (e.g., RC data based on current configuration data) and a master RC data (e.g., RC data based on initial configuration data) may be compared. The above process may be repeated until there is a mismatch between the current RC data and the master RC data.

When there is the mismatch, an exception event may be performed (e.g., such as communicating an interrupt data to a process of the programmable device or reloading the configuration registers with the initial configuration data). It is appreciated that the checksums, horizontal redundancy check, vertical redundancy check, and cryptographic message digest are well-known to those skilled in the art of signal error detection. It is also appreciated that the programmable device includes a microcontroller, a programmable logic device (PLD), a field programmable gate array (FPGA), and other types of programmable device.

In summary, embodiments described herein pertain to methods and systems of continuously checking the integrity of configuration data present in the configuration registers of a programmable device. The state of the configuration data may be checked with the original configuration data stored to a different location. The DMA controller of the programmable device may enable to run the error-detection operation in background without sacrificing the performance of the programmable device.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A method of operating a programmable device, the method comprising:
    loading an original configuration data to configuration registers of the programmable device, wherein the original configuration data comprises data to establish a plurality of functional blocks in the programmable device to perform user-defined logic functions;
    accessing first master redundancy check (RC) data corresponding to an RC operation of the original configuration;
    accessing second master RC data corresponding to an RC operation of the original configuration;
    comparing the first master RC data with the second master RC data;
    performing a first exception action if the second master RC data does not match with the first master RC data;
    generating current RC data by performing a RC operation of a current configuration data of the configuration registers of the programmable device;
    comparing the current RC data with the first master RC data; and
    performing a second exception action if the current RC data does not match with the first master RC data.

2. The method of claim 1, wherein the configuration data comprises additional data to configure input/output resources.

3. The method of claim 1, wherein the configuration data comprises additional data to configure programmable analog blocks.

4. The method of claim 1, wherein the configuration data comprises additional data to configure routing resources.

5. The method of claim 1, further comprising repeatedly generating and comparing the current RC and performing the second exception action when the current RC data does not match with the first master RC data.

6. The method of claim 1, wherein the generating of the current RC data is controlled by a direct memory access (DMA) controller.

7. The method of claim 1, wherein the RC data is at least one of a checksum, cyclic redundancy check (CRC) data, horizontal redundancy check data, vertical redundancy check data or a cryptographic message digest.

8. A method of operating a programmable device, the method comprising:
    loading an original configuration data to configuration registers of the programmable device, wherein the original configuration data comprises data to establish a plurality of functional blocks in the programmable device to perform user-defined logic functions;
    performing a redundancy check (RC) of the original configuration data to produce a first master RC data;
    performing a RC of the original configuration data to produce a second master RC data;
    comparing the second master RC data with the first master RC data to determine whether there is a mismatch between the second master RC data and the first master RC data;
    performing a RC of a current configuration data of the configuration registers to produce a current RC data; and
    comparing the current RC data with the first master RC data to determine whether there is a mismatch between the current RC data and the first master RC data.

9. The method of claim 8, wherein the configuration data comprises additional data to configure input/output resources.

10. The method of claim 8, wherein the redundancy check of the original configuration data or the current configuration data is performed using a direct access memory (DMA) controller.

11. The method of claim 8, wherein the configuration data comprises additional data to configure programmable analog blocks.

12. The method of claim 8, wherein the configuration data comprises additional data to configure routing resources.

13. The method of claim 8, where comparing the second master RC data to the first master RC data and comparing the current master RC data to the first master RC data is performed iteratively.

14. A system of operating a programmable device, the system comprising:
    a redundancy check (RC) generator to perform RC operations;
    a first memory to store first master RC data obtained through performing a first RC operation of original configuration data initially loaded to configuration registers of the programmable device, wherein the configuration registers comprise registers to store data to establish a plurality of functional blocks in the programmable device to perform user-defined logic functions;
    a second memory to store second master RC data obtained through performing a second RC operation of the original configuration data;
    a third memory to store a current RC data obtained through performing a third RC operation of current configuration data of the configuration registers; and
    a comparator module to compare the second master RC data to the first master RC data and to compare the current RC data to the first master RC data.

15. The system of claim 14, wherein the configuration registers comprise additional registers to store additional data to configure input/output resources.

16. The system of claim 15, further comprising a direct memory access (DMA) controller coupled to the first memory and the second memory to access the master RC data and the current RC data.

17. The system of claim 15, wherein the master RC data and the current RC data are at least one of a checksum, cyclic redundancy check (CRC) data, horizontal redundancy check data, vertical redundancy check data or a cryptographic message digest.

18. The system of claim 15, wherein comparator module is configured to generate an exception signal when the current RC data does not match with the master RC data.

19. The system of claim 14, wherein the configuration registers comprise additional registers to store additional data to configure programmable analog blocks.

20. The system of claim 14, wherein the configuration registers comprise additional registers to store additional data to configure routing resources.

* * * * *